United States Patent
Choe et al.

(10) Patent No.: US 9,824,617 B2
(45) Date of Patent: Nov. 21, 2017

(54) DATA DRIVER AND DISPLAY DEVICE INCLUDING THE SAME

(71) Applicant: Samsung Display Co., Ltd., Yongin-si (KR)

(72) Inventors: Weonjun Choe, Hwaseong-si (KR); Jeongil Yoo, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 141 days.

(21) Appl. No.: 14/855,973

(22) Filed: Sep. 16, 2015

(65) Prior Publication Data
US 2016/0171953 A1 Jun. 16, 2016

(30) Foreign Application Priority Data
Dec. 15, 2014 (KR) ........................ 10-2014-0180564

(51) Int. Cl.
*G09G 3/20* (2006.01)
*H03M 1/66* (2006.01)

(52) U.S. Cl.
CPC .............. *G09G 3/2003* (2013.01); *G09G 3/20* (2013.01); *G09G 2300/0408* (2013.01); *G09G 2310/027* (2013.01); *G09G 2310/0291* (2013.01); *G09G 2310/0297* (2013.01); *G09G 2320/0276* (2013.01); *H03M 1/662* (2013.01)

(58) Field of Classification Search
CPC ..... G09G 2300/0408; G09G 2310/027; G09G 2310/0291; G09G 2310/0297; G09G 2320/0276; G09G 3/20; G09G 3/2003; H03M 1/662

USPC ......................................................... 345/213
See application file for complete search history.

(56) References Cited

U.S. PATENT DOCUMENTS

| 7,339,511 | B2 | 3/2008 | Son et al. |
| 7,808,493 | B2 | 10/2010 | Hashimoto et al. |
| 7,834,841 | B2 | 11/2010 | Harada |
| 8,854,294 | B2 | 10/2014 | Sakariya |
| 2002/0030653 | A1* | 3/2002 | Cairns .................. G09G 3/2011 345/87 |
| 2003/0151575 | A1 | 8/2003 | Udo et al. |
| 2009/0179847 | A1* | 7/2009 | Harada ................ G09G 3/3688 345/98 |
| 2014/0049533 | A1* | 2/2014 | Saitoh ...................... G09G 3/20 345/213 |

FOREIGN PATENT DOCUMENTS

| JP | 2003-241716 | 8/2003 |
| JP | 2007-310234 | 11/2007 |
| JP | 5244402 | 4/2013 |
| KR | 10-0633537 | 10/2006 |
| KR | 10-0910506 | 7/2009 |
| KR | 10-1148222 | 5/2012 |
| KR | 10-1174985 | 8/2012 |

* cited by examiner

*Primary Examiner* — Tony Davis
(74) *Attorney, Agent, or Firm* — H.C. Park & Associates, PLC (57) ABSTRACT

A data driver electrically connected to data lines includes a digital-to-analog converter configured to sequentially receive data signals respectively corresponding to the data lines and outputting an analog image signal, and a switching output unit configured to sequentially output the analog image signal outputted from the digital-to-analog converter as analog driving signals respectively corresponding to the data lines in synchronization with a clock signal.

18 Claims, 4 Drawing Sheets

DATA DRIVER AND DISPLAY DEVICE INCLUDING THE SAME

CROSS-REFERENCE TO RELATED APPLICATIONS

This application claims priority from and the benefit of Korean Patent Application No. 10-2014-0180564, filed on Dec. 15, 2014, which is hereby incorporated by reference for all purposes as if fully set forth herein.

BACKGROUND

Field

Exemplary embodiments of the present invention relate to a data driver and a display device including the same.

Discussion of the Background

A display device may generally include a display panel for displaying an image, and a data driver and a gate driver for driving the display panel. The display panel may include gate lines, data lines, and pixels. Each of the pixels may include a switching transistor, a liquid crystal capacitor, and a storage capacitor. The data driver may output a data driving signal to data lines and the gate driver may output a gate driving signal for driving the gate lines.

After applying a gate-on voltage to a predetermined gate line by the gate driver, the display device may provide a data voltage corresponding to an image signal to the data lines through the data driver to display an image.

An image provided from the outside may be a digital signal. Therefore, the data driver may require a digital-to-analog converter for converting an image, from a digital signal into a data voltage. The digital-to-analog converter may include a switching circuit for outputting a data voltage corresponding to an image signal among gamma voltages. The digital-to-analog converter may include switching circuits respectively corresponding to the data lines.

As the size of a display panel is increased, the number of data lines that one data driver integrated circuit (IC) drives may become greater. Since the number of switching circuits equipped in a digital-to-analog converter may be increased in proportion to the number of data lines, the circuit area of a digital driver IC may be increased.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a data driver with a reduced circuit area.

Exemplary embodiments of the present invention also provide a data driver including a data driver with a reduced circuit area.

Additional aspects will be set forth in the detailed description which follows, and, in part, will be apparent from the disclosure, or may be learned by practice of the inventive concept.

According to an exemplary embodiment of the present invention, a data driver is electrically connected to data lines, the data driver includes a digital-to-analog converter sequentially receiving data signals respectively corresponding to the data lines and outputting an analog image signal, and a switching output unit sequentially outputting the analog image signal outputted from the digital-to-analog converter as analog driving signals respectively corresponding to the data lines in synchronization with a clock signal.

The switching output unit may include a switching control unit outputting a switching signal in synchronization with the clock signal, and a demultiplexer sequentially outputting the analog image signal outputted from the digital-to-analog converter as the analog driving signals respectively corresponding to the data lines in response to the switching signal.

The data lines may be sequentially arranged in a first direction, and the demultiplexer sequentially may output the analog driving signals to correspond to an order in which the data lines are arranged.

The data lines may be sequentially arranged in a first direction, and the demultiplexer sequentially may output the analog driving signals to correspond to a reverse order in which the data lines are arranged.

The data driver may further include an output buffer outputting the analog driving signals to the data lines in response to a line latch signal.

The digital-to-analog converter may include a first digital-to-analog converter corresponding to a first group of data lines among the data lines, and a second digital-to-analog converter corresponding to a second group of data lines among the data lines.

The switching output unit may include a first switching control unit outputting a first switching signal in synchronization with the clock signal, a first demultiplexer sequentially outputting the analog image signal outputted from the first digital-to-analog converter as first analog driving signals respectively corresponding to the first group of data lines in response to the first switching signal, a second switching control unit outputting a second switching signal in synchronization with the clock signal, and a second demultiplexer sequentially outputting the analog image signal outputted from the second digital-to-analog converter as second analog driving signals respectively corresponding to the second group of data lines in response to the second switching signal.

According to an exemplary embodiment of the present invention a display device includes a display panel including pixels respectively connected to gate lines and data lines, a gate driver driving the gate lines, a data driver driving the data lines, and a timing controller providing a clock signal, a line latch signal, and a data signal to the data driver and controlling the gate driver, in which the data driver includes a digital-to-analog converter sequentially receiving data signal respectively corresponding to the data lines and output an analog image signal, and a switching output unit sequentially outputting the analog image signal output from the digital-to-analog converter as analog driving signals respectively corresponding to the data lines in synchronization with a clock signal.

The switching output unit may include a switching control unit outputting a switching signal in synchronization with the clock signal, and a demultiplexer sequentially outputting the analog image signal outputted from the digital-to-analog converter as the analog driving signals corresponding to each of the data lines in response to the switching signal.

The data lines may be sequentially arranged in a first direction, and the demultiplexer may be configured to sequentially output the analog driving signals to correspond to an order in which the data lines are arranged.

The data lines may be sequentially arranged in a first direction, and the demultiplexer may be configured to sequentially output the analog driving signals to correspond to a reverse order in which the data lines are arranged.

The data driver may further include an output buffer outputting the analog driving signals to the data lines in response to the line latch signal.

The digital-to-analog converter may include a first digital-to-analog converter corresponding to a first group of data lines among the data lines, and a second digital-to-analog converter corresponding to a second r group of data lines among the data lines.

The switching output unit may include a first switching control unit outputting a first switching signal in synchronization with the clock signal, a first demultiplexer sequentially outputting the analog image signal outputted from the first digital-to-analog converter as first analog driving signals respectively corresponding to the first group of data lines in response to the first switching signal, a second switching control unit outputting a second switching signal in synchronization with the clock signal, and a second demultiplexer sequentially outputting the analog image signal outputted from the second digital-to-analog converter as second analog driving signals respectively corresponding to the second group of data lines in response to the second switching signal.

The display devices may further include a gamma voltage generator configured to generate gamma voltages, in which the digital-to-analog converter may be configured to convert the data signal to the analog image signal on the basis of the gamma voltages.

According to an exemplary embodiment of the present invention, a method of driving a data driver electrically connected to data lines includes sequentially receiving data signals respectively corresponding to the data lines by a digital-to-analog converter, outputting an analog image signal by the digital-to-analog converter to a demultiplexer, generating a switching signal synchronized with a clock signal by a switching control unit, synchronizing the received analog image signal with the clock signal by the demultiplexer, and sequentially outputting the synchronized analog image signal as analog driving signals respectively corresponding to the data lines in response to receiving the switching signal by the demultiplexer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
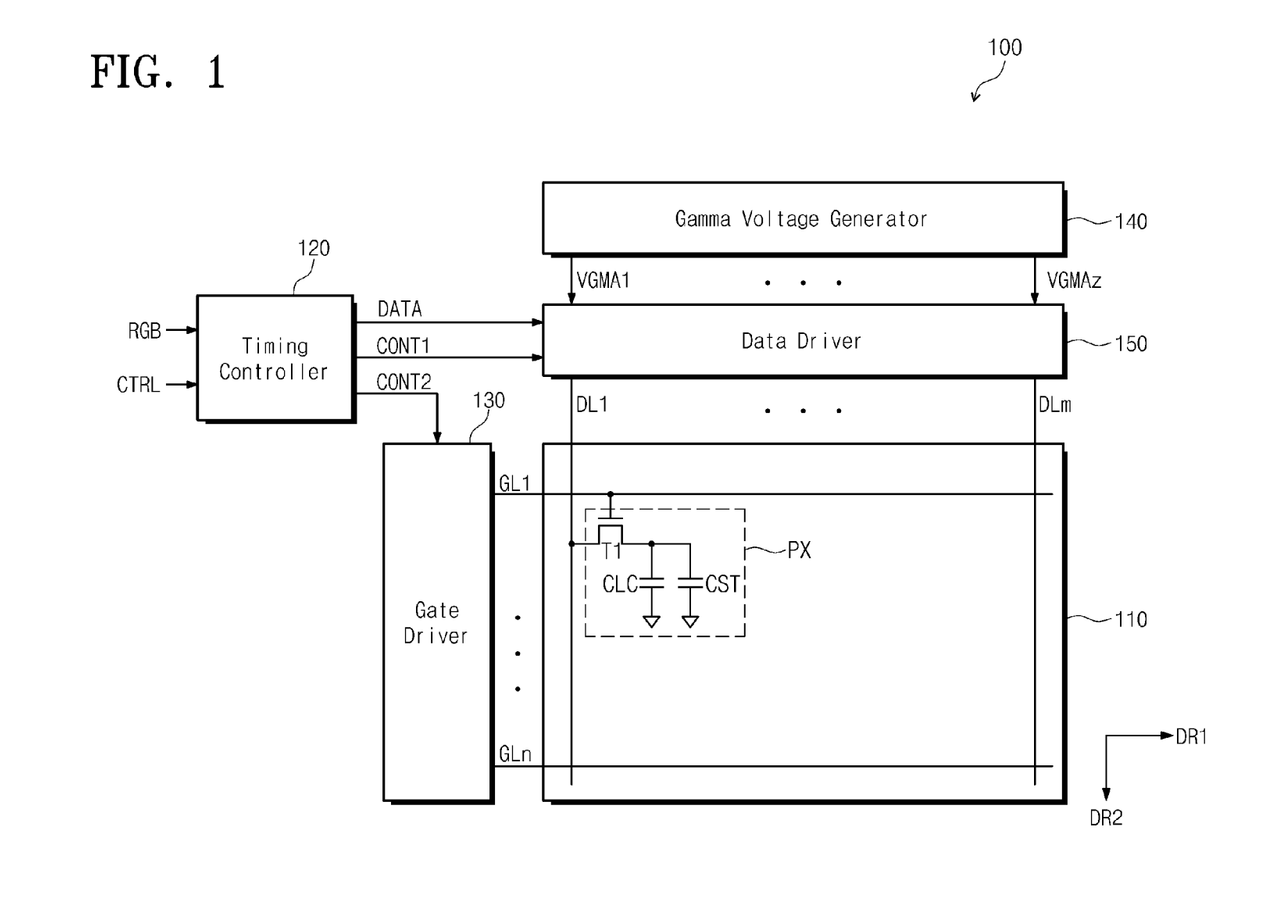
FIG. 1 is a block diagram of a display device according to an exemplary embodiment of the present invention.

FIG. 1 is a block diagram of a display device according to an exemplary embodiment of the present invention. Although a liquid crystal display device is illustrated as one example of a display device in the description below, the display device may include any display device requiring a digital-to-analog converter.

Referring to FIG. 1, a display device 100 includes a display panel 110, a timing controller 120, a gate driver 130, a gamma voltage generator 140, and a data driver 150.

The display panel 110 includes gate lines GL1 to GLn extending in a first direction DR1, data lines DL1 to DLm intersecting the gate lines GL1 to GLn to extend in a second direction DR2, and pixels PX arranged in a matrix in intersection areas thereof. The gate lines GL1 to GLn and the data lines DL1 to DLm are insulated from each other.

Each pixel PX includes a switching transistor T1 connected to a corresponding data line and gate line, and a liquid crystal capacitor CLC and a storage capacitor CST connected thereto.

The timing controller 120 receives an image signal RGB and control signals CTRL, such as a vertical sync signal, a parallel sync signal, a main clock signal, and a data enable signal, for controlling the image signal RGB from the outside. The timing controller 120 provides a data signal DATA obtained by processing the image signal RGB to correspond to an operating condition of the display panel 110 and a first control signal CONT1 to the data driver 150, and provides a second control signal CONT2 to the gate driver 130. The first control signal CONT1 may include a clock signal CLK and a line latch signal LOAD, and the second control signal CONT2 may include a vertical sync start signal, an output enable signal, and a gate pulse signal.

The gate driver 130 drives the gate lines GL1 to GLn in response to the second control signal CONT2 from the timing controller 120. The gate driver 130 includes a gate driving integrated circuit (IC). The gate driver 130 may be implemented with a circuit using an oxide semiconductor, an amorphous semiconductor, a crystalline semiconductor, and a polycrystalline semiconductor.

The gamma voltage generator 140 generates gamma voltages VGMA1 to VGMAz.

The data driver 150 drives the data lines DL1 to DLm by using the gamma voltages VGMA1 to VGMAz in response to the data signal DATA and the first control signal CONT1 from the timing controller 120. The data driver 150 may be implemented with an IC. The data driver 150 implemented with an IC may be mounted on a tape carrier package (TCP) or a chip on film (COF) to be electrically connected to the display panel 110. Alternatively, the data driver 150 may be directly mounted on the display panel 110.

While a gate-on voltage is applied to one gate line by the gate driver 130, switching transistors of one row connected thereto may be turned on. At this point, the data driver 150 provides grayscale voltages corresponding to the data signal DATA to the data lines DL1 to DLm. The grayscale voltages supplied to the data lines DL1 to DLm are applied to corresponding liquid crystal capacitors CLC and storage capacitors CST through the turned-on switching transistors.

Figure 2:
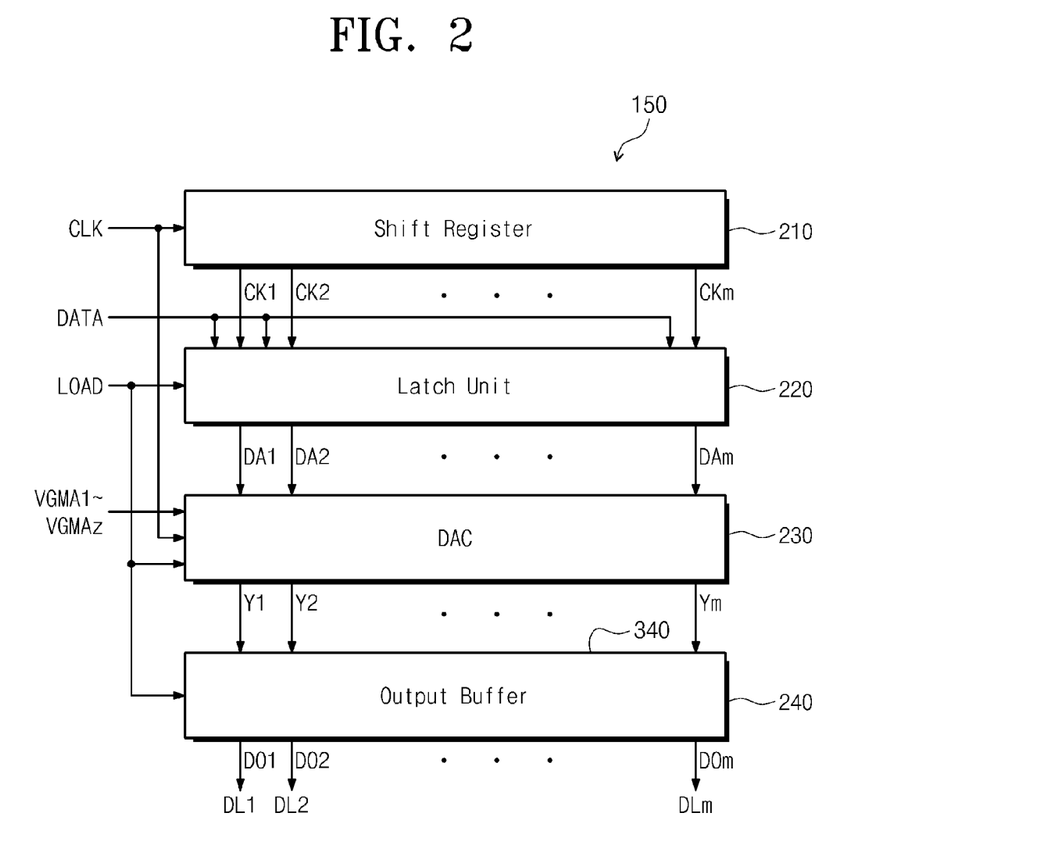
FIG. 2 is a block diagram illustrating a configuration of a data driver shown in FIG. 1.

FIG. 2 is a block diagram illustrating a configuration of the data driver shown in FIG. 1.

Referring to FIG. 2, the data driver 150 includes a shift register 210, a latch unit 220, a digital-to-analog converter (DAC) 230, and an output buffer 240.

In FIG. 2, a clock signal CLK and a line latch signal LOAD are signals included in the first control signal CONT1 provided from the timing controller 120 shown in FIG. 1.

The shift register 210 sequentially activates latch clock signals CK1 to CKm in synchronization with the clock signal CLK. The latch unit 220 latches a data signal DATA in synchronization with the latch clock signals CK1 to CKm from the shift register 210 and provides latch data signals DA1 to DAm to the digital-to-analog converter 230 in response to the line latch signal LOAD.

The digital-to-analog converter 230 receives gamma voltages VGMA1 to VGMAz from the gamma voltage generator 140 shown in FIG. 1 in response to the clock signal CLK and the line latch signal LOAD, and outputs a gamma voltage corresponding to the latch data signals DA to DAm from the latch unit 220, as analog image signals Y1 to Ym, to the output buffer 240.

In response to the line latch signal LOAD, the output buffer 240 simultaneously drives the data lines DL1 to DLm through output signals DO1 to DOm corresponding to the analog image signals Y1 to Ym from the digital-to-analog converter 230.

Figure 3:
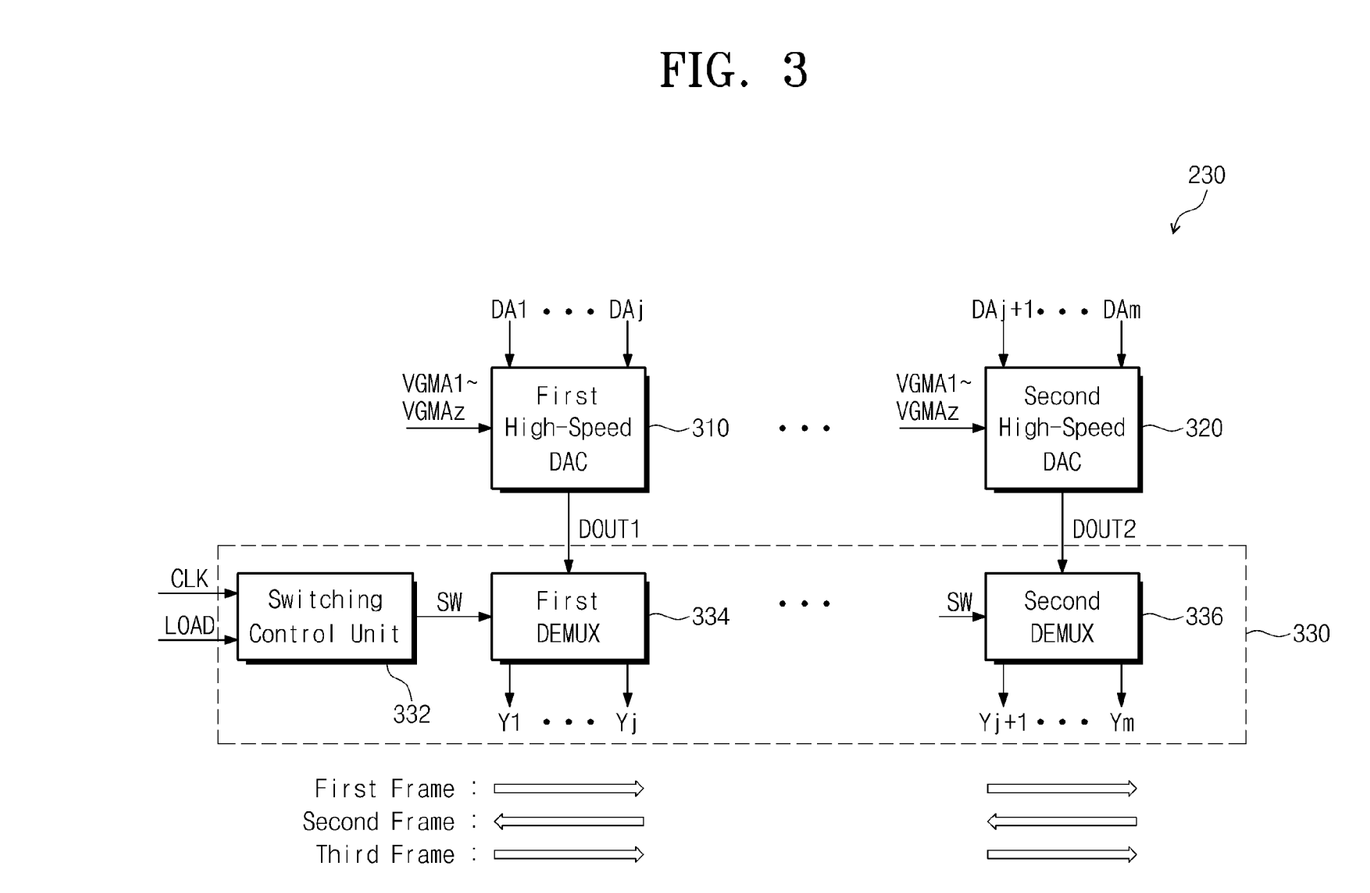
FIG. 3 is a block diagram illustrating a configuration of a digital-to-analog converter shown in FIG. 2.

FIG. 3 is a block diagram illustrating a configuration of the digital-to-analog converter shown in FIG. 2.

Referring to FIG. 3, the digital-to-analog converter 230 includes a first high-speed digital-to-analog converter (DAC) 310, a second high-speed digital-to-analog converter (DAC) 320, and a switching output unit 330.

The first high-speed DAC 310 receives one group of data signals DA1 to DAj among the latch data signals DA1 to DAm outputted from the latch unit 220 shown in FIG. 2. The first high-speed DAC 310 sequentially outputs a first gamma output voltage DOUT1 corresponding to the group of data signals DA1 to DAj, on the basis of gamma voltages VGMA1 to VGMAz from the gamma voltage generator 140 shown in FIG. 1. More particularly, the first high-speed DAC 310 sequentially outputs the latch data signals DA1 to DAj, which is a digital signal, as the first gamma output voltage DOUT1, which is an analog signal, through a time division manner. For example, the first high-speed DAC 310 converts the latch data signal DA1 into the first gamma output voltage DOUT1 and then outputs the first gamma output voltage DOUT1 at the first timing, converts the latch data signal DA2 into the first gamma output voltage DOUT1 and then outputs the first gamma output voltage DOUT1 at the second timing, and converts the latch data signal DAj into the first gamma output voltage DOUT1 and then outputs the first gamma output voltage DOUT1 at the jth timing, The first high-speed DAC 310 includes a switching circuit (not shown) for selecting gamma voltages respectively corresponding to the group of data signals DA1 to DAj among the gamma voltages VGMA1 to VGMAz. According to the present exemplary embodiment, since the first high-speed DAC 310 performs digital-to-analog conversion through a time division manner, the circuit area of the first high-speed DAC 310 may be reduced.

The second high-speed DAC 320 receives another group of data signals DAj+1 to DAm among the latch data signals DA1 to DAm outputted from the latch unit 220 shown in FIG. 2. The second high-speed DAC 320 sequentially outputs a second gamma output voltage DOUT2 corresponding to the group of data signals DAj+1 to DAm on the basis of the gamma voltages VGMA1 to VGMAz from the gamma voltage generator 140 shown in FIG. 1. More particularly, the second high-speed DAC 320 sequentially outputs the latch data signals DAj+1 to DAm, which is a digital signal, as the second gamma output voltage DOUT2, which is an analog signal, through a time division manner. For example, the second high-speed DAC 320 converts the latch data signal DAj+1 into the second gamma output voltage DOUT2 and then outputs the second gamma output voltage DOUT2 at the first timing, converts the latch data signal DAj+2 into the second gamma output voltage DOUT2 and then outputs the second gamma output voltage DOUT2 at the second timing, and converts the latch data signal DAm into the second gamma output voltage DOUT2 and then outputs the second gamma output voltage DOUT2 at the jth timing (if and only if m=2*j).

The second high-speed DAC 320 includes a switching circuit (not shown) for selecting gamma voltages respectively corresponding to the group of data signals DAj+1 to DAm among the gamma voltages VGMA1 to VGMAz. According to the present exemplary embodiment, since the second high-speed DAC 320 performs digital-to-analog conversion through a time division manner, the circuit area of the second high-speed DAC 320 may be reduced.

As a switching circuit equipped in the first high-speed DAC 310 and the second high-speed DAC 320 becomes simplified, the Electro Magnetic Interference (EMI) of the digital-to-analog converter 230 and power consumption of the digital-to-analog converter 230 may be reduced.

The switching output unit 330 includes a switching control unit 332, a first demultiplexer (DEMUX) 334, and a second demultiplexer (DEMUX) 336. The switching output unit 330 outputs a switching signal SW in synchronization with a clock signal CLK and a line latch signal LOAD. The first DEMUX 334 sequentially outputs the first gamma output voltage DOUT1 as analog image signals Y1 to Yj in response to the switching signal SW. The second DEMUX 336 sequentially outputs the second gamma output voltage DOUT2 as analog image signals Yj+1 to Ym in response to the switching signal SW. The analog image signals Y1 to Yj outputted from the first DEMUX 334 and the analog image signals Yj+1 to Ym outputted from the second DEMUX 336 are provided to the output buffer 240 shown in FIG. 2.

Even when the analog image signals Y1 to Yj outputted from the first DEMUX 334 and the analog image signals Yj+1 to Ym outputted from the second DEMUX 336 have different output timings, the output buffer 240 shown in FIG. 2 may simultaneously drive the data lines DL1 to DLm through the output signals DO1 to DOm in response to the line latch signal LOAD. Therefore, the different output timings may not deteriorate the quality of an image displayed on the display panel 110 shown in FIG. 1.

According to the present exemplary embodiment illustrated with reference to FIG. 3, the digital-to-analog converter 230 may include the two high-speed DACs 310 and 320. However, the number of high-speed DACs included in the digital-to-analog converter 230 may vary.

The switching control unit 332 may output the switching signal SW to change the output order of the analog image signals Y1-Ym. For example, according to an arrangement order of the data lines DL1 to DLm in the first direction DR1, the switching control unit 332 may output the switching signal SW to allow the first DEMUX 334 to output the analog image signals in the order of Y1→Y2→ . . . →Yj. Additionally, according to a reverse arrangement order of the data lines DL1 to DLm in the first direction DR1, the switching control unit 332 may output the switching signal SW to allow the first DEMUX 334 to output the analog image signals in the order of Yj→Yj−1→ . . . →Y1.

According to an exemplary embodiment of the present invention, the switching control unit 332 may output the switching signal SW to change the output order of the analog image signals Y1-Ym at each frame in synchronization with the line latch signal LOAD. The line latch signal LOAD is a pulse signal that may be activated at each frame. For example, the switching control unit 332 may output the switching signal SW to allow the analog image signals to be outputted in the order of Y1→Y2→ . . . →Yj during odd-numbered frames and the analog image signals to be outputted in the reverse order of Yj→Yj−1→ . . . →Y1 during even-numbered frames. By changing the output order of the analog image signals Y1 to Ym at each frame in such a way, it may be possible to prevent the noise of a display image according to the output order of the analog image signals Y1 to Ym. The switching control unit 332 may output the switching signal SW to allow the output order of the analog image signals Y1-Ym to be changed at each frame or F frames (F is a positive integer).

Figure 4:
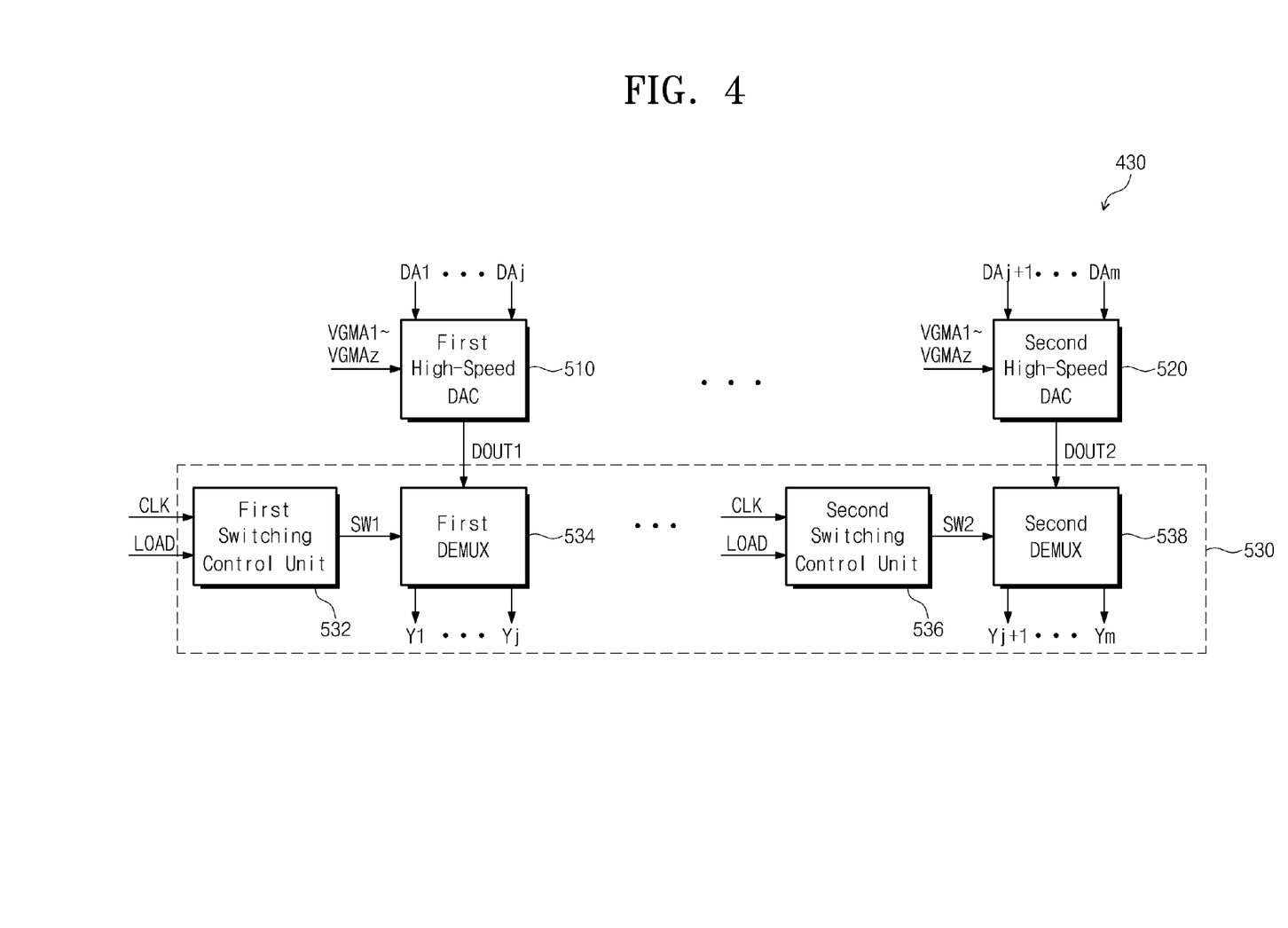
FIG. 4 is a block diagram illustrating a configuration of a digital-to-analog converter shown in FIG. 2.

FIG. 4 is a block diagram illustrating a configuration of the digital-to-analog converter shown in FIG. 2 according to an exemplary embodiment of the present invention.

Referring to FIG. 4, a digital-to-analog converter 430 includes a first high-speed digital-to-analog converter (DAC) 510, a second high-speed digital-to-analog converter (DAC) 520, and a switching output unit 530.

The first high-speed DAC 510 receives one group of data signals DA1 to DAj among the latch data signals DA1 to DAm outputted from the latch unit 220 shown in FIG. 2. The first high-speed DAC 510 sequentially outputs a first gamma output voltage DOUT1 corresponding to the group of data signals DA1 to DAj on the basis of gamma voltages VGMA1 to VGMAz from the gamma voltage generator 140 shown in FIG. 1. More particularly, the first high-speed DAC 510 sequentially outputs the latch data signals DA1 to DAj, which is a digital signal, as the first gamma output voltage DOUT1, which is an analog signal, through a time division manner.

The second high-speed DAC 520 receives another group of data signals DAj+1 to DAm among the latch data signals DA1 to DAm outputted from the latch unit 220 shown in FIG. 2. The second high-speed DAC 520 sequentially outputs a second gamma output voltage DOUT2 corresponding to the other group of data signals DAj+1 to DAm on the basis of the gamma voltages VGMA1 to VGMAz from the gamma voltage generator 140 shown in FIG. 1. More particularly, the second high-speed DAC 520 sequentially outputs the latch data signals DAj+1 to DAm, which is a digital signal, as the second gamma output voltage DOUT2, which is an analog signal, through a time division manner.

The switching output unit 530 includes a first switching control unit 532, a first demultiplexer (DEMUX) 534, a second switching control unit 536, and a second demultiplexer (DEMUX) 538. The first switching control unit 532 outputs a first switching signal SW1 in synchronization with a clock signal CLK and a line latch signal LOAD. The first DEMUX 534 sequentially outputs the first gamma output voltage DOUT1 as analog image signals Y1 to Yj in response to the switching signal SW. The second switching control unit 536 outputs a second switching signal SW2 in synchronization with a clock signal CLK and a line latch signal LOAD. The second DEMUX 538 sequentially outputs the second gamma output voltage DOUT2 as analog image signals Yj+1 to Ym in response to the second switching signal SW2. The analog image signals Y1 to Yj outputted from the first DEMUX 534 and the analog image signals Yj+1–Ym outputted from the second DEMUX 538 are provided to the output buffer 240 shown in FIG. 2.

The digital-to-analog converter 430 shown in FIG. 4 includes first and second switching control units 532 and 536 respectively corresponding to the first and second DEMUXs 534 and 538. As the first and second switching control units 532 and 536 are arranged respectively adjacent to the first and second DEMUXs 534 and 538, lengths of signal lines delivering the first and second switching signals SW1 and SW2 may be shortened. Therefore, signal delay due to a load on a signal path may be reduced.

A data driver having a configuration according to the present exemplary embodiment may include a high-speed digital-to-analog converter to drive data lines in a time division manner. Since a high-speed digital-to-analog converter may require at least a switching circuit for outputting a data voltage corresponding to an image signal among gamma voltages, the circuit area of a data driver IC may be reduced.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A data driver electrically connected to data lines, the data driver comprising:
   a digital-to-analog converter configured to sequentially receive data signals respectively corresponding to the data lines and output an analog image signal; and
   a switching output unit comprising:
      a switching control unit configured to output a switching signal in synchronization with a clock signal; and
      a demultiplexer configured to sequentially output the analog image signal outputted from the digital-to-analog converter as analog driving signals respectively corresponding to the data lines in response to the switching signal,
   wherein:
   the data lines are sequentially arranged in a first direction; and
   the demultiplexer sequentially outputs the analog driving signals to correspond to a reverse order in which the data lines are arranged during a first frame.

2. The data driver of claim 1, wherein:
   the demultiplexer sequentially outputs the analog driving signals to correspond to an order in which the data lines are arranged during a second frame.

3. The data driver of claim 1, wherein the data driver further comprises an output buffer configured to output the analog driving signals to the data lines in response to a line latch signal.

4. The data driver of claim 3, wherein the output buffer is connected between the demultiplexer and the data lines.

5. The data driver of claim 1, wherein the digital-to-analog converter comprises:
   a first digital-to-analog converter corresponding to a first group of data lines among the data lines; and
   a second digital-to-analog converter corresponding to a second group of data lines among the data lines.

6. The data driver of claim 5, wherein the switching output unit comprises:

a first switching control unit configured to output a first switching signal in synchronization with the clock signal;
   a first demultiplexer configured to sequentially output the analog image signal outputted from the first digital-to-analog converter as first analog driving signals respectively corresponding to the first group of data lines in response to the first switching signal;
   a second switching control unit configured to output a second switching signal in synchronization with the clock signal; and
   a second demultiplexer configured to sequentially output the analog image signal outputted from the second digital-to-analog converter as second analog driving signals respectively corresponding to the second group of data lines in response to the second switching signal.

7. A display device, comprising:
   a display panel comprising pixels respectively connected to gate lines and data lines;
   a gate driver configured to drive the gate lines;
   a data driver configured to drive the data lines; and
   a timing controller configured to provide a clock signal, a line latch signal, and a data signal to the data driver and control the gate driver,
   wherein:
   the data driver comprises:
      a digital-to-analog converter configured to sequentially receive data signals respectively corresponding to the data lines and output an analog image signal; and
      a switching output comprising:
         a switching control unit configured to output a switching signal in synchronization with the clock signal; and
         a demultiplexer configured to sequentially output the analog image signal outputted from the digital-to-analog converter as the analog driving signals corresponding to each of the data lines in response to the switching signal:
   the data lines are sequentially arranged in a first direction; and
   the demultiplexer is configured to sequentially output the analog driving signals to correspond to a reverse order in which the data lines are arranged during a first frame.

8. The display device of claim 7, wherein
   the demultiplexer is configured to sequentially output the analog driving signals to correspond to an order in which the data lines are arranged during a second frame.

9. The display device of claim 7, wherein the data driver further comprises an output buffer configured to output the analog driving signals to the data lines in response to the line latch signal.

10. The display device of claim 9, wherein the output buffer is connected between the demultiplexer and the data lines.

11. The display device of claim 7, wherein the digital-to-analog converter comprises:
    a first digital-to-analog converter corresponding to a first group of data lines among the data lines; and
    a second digital-to-analog converter corresponding to a second group of data lines among the data lines.

12. The display device of claim 11, wherein the switching output unit comprises:
    a first switching control unit configured to output a first switching signal in synchronization with the clock signal;

a first demultiplexer configured to sequentially output the analog image signal outputted from the first digital-to-analog converter as first analog driving signals respectively corresponding to the first group of data lines in response to the first switching signal;

a second switching control unit configured to output a second switching signal in synchronization with the clock signal; and a second demultiplexer configured to sequentially output the analog image signal outputted from the second digital-to-analog converter as second analog driving signals respectively corresponding to the second group of data lines in response to the second switching signal.

13. The display device of claim 7, further comprising a gamma voltage generator configured to generate gamma voltages, wherein the digital-to-analog converter is configured to convert the data signal to the analog image signal on the basis of the gamma voltages.

14. A method of driving a data driver electrically connected to data lines, the method comprising:

sequentially receiving data signals respectively corresponding to the data lines by a digital-to-analog converter;

outputting an analog image signal by the digital-to-analog converter to a demultiplexer;

generating a switching signal synchronized with a clock signal by a switching control unit;

synchronizing the received analog image signal with the clock signal by the demultiplexer; and sequentially outputting the synchronized analog image signal as analog driving signals respectively corresponding to the data lines in response to receiving the switching signal by the demultiplexer, wherein:

the data lines are sequentially arranged in a first direction; and the demultiplexer sequentially outputs the analog driving signals to correspond to a reverse order in which the data lines are arranged during a first frame.

15. The method of claim 14, further comprising receiving and outputting the analog driving signals to the data lines in response to a line latch signal by an output buffer.

16. The method of claim 15, wherein the digital-to-analog converter converts the received data signal to the analog image signal based on gamma voltages generated by a gamma voltage generator.

17. The method of claim 15, wherein the output buffer is connected between the demultiplexer and the data lines.

18. The method of claim 14, wherein:

the demultiplexer sequentially outputs the analog driving signals to correspond to an order in which the data lines are arranged during a second frame.

* * * * *